(12) United States Patent
Yip et al.

(10) Patent No.: US 11,670,684 B2
(45) Date of Patent: Jun. 6, 2023

(54) SEMICONDUCTOR TRANSISTOR DEVICE AND METHOD OF MANUFACTURING THE SAME

(71) Applicant: Infineon Technologies Austria AG, Villach (AT)

(72) Inventors: Li Juin Yip, Villach (AT); Oliver Blank, Villach (AT); Heimo Hofer, Bodensdorf (AT); Michael Hutzler, Villach (AT); Ralf Siemieniec, Villach (AT)

(73) Assignee: Infineon Technologies Austria AG, Villach (AT)

( * ) Notice: Subject to any disclaimer, the term of this patent is extended or adjusted under 35 U.S.C. 154(b) by 67 days.

(21) Appl. No.: 17/163,780

(22) Filed: Feb. 1, 2021

(65) Prior Publication Data

US 2021/0249510 A1 Aug. 12, 2021

(30) Foreign Application Priority Data

Feb. 7, 2020 (EP) .................................... 20156150

(51) Int. Cl.
*H01L 29/66* (2006.01)
*H01L 29/10* (2006.01)
*H01L 29/78* (2006.01)

(52) U.S. Cl.
CPC ...... *H01L 29/1087* (2013.01); *H01L 29/1095* (2013.01); *H01L 29/66712* (2013.01); *H01L 29/7802* (2013.01)

(58) Field of Classification Search
CPC ............ H01L 29/1087; H01L 29/1095; H01L 29/66712; H01L 29/7802; H01L 29/407; H01L 29/41741; H01L 29/41766; H01L 29/456; H01L 29/66727; H01L 29/7813; H01L 29/7827; H01L 29/0684; H01L 29/66666; H01L 29/66734; H01L 29/0696
See application file for complete search history.

(56) References Cited

U.S. PATENT DOCUMENTS

| | | |
|---|---|---|
| 2010/0171173 A1 | 7/2010 | Hsieh |
| 2011/0018059 A1 | 1/2011 | Dunn et al. |
| 2018/0047722 A1* | 2/2018 | Nishimura .......... H01L 29/7803 |
| 2018/0076308 A1* | 3/2018 | Matsuo ............... H01L 29/6634 |
| 2019/0122926 A1 | 4/2019 | Darwish et al. |

* cited by examiner

*Primary Examiner* — Shahed Ahmed
*Assistant Examiner* — Khatib A Rahman
(74) *Attorney, Agent, or Firm* — Murphy, Bilak & Homiller, PLLC

(57) ABSTRACT

The application relates to a semiconductor transistor device, having a source region, a body region including a channel region extending in a vertical direction, a drain region, a gate region arranged aside the channel region in a lateral direction, and a body contact region made of an electrically conductive material, wherein the body contact region forms a body contact area, the body contact region being in an electrical contact with the body region via the body contact area, and wherein the body contact area is tilted with respect to the vertical direction and the lateral direction.

19 Claims, 10 Drawing Sheets

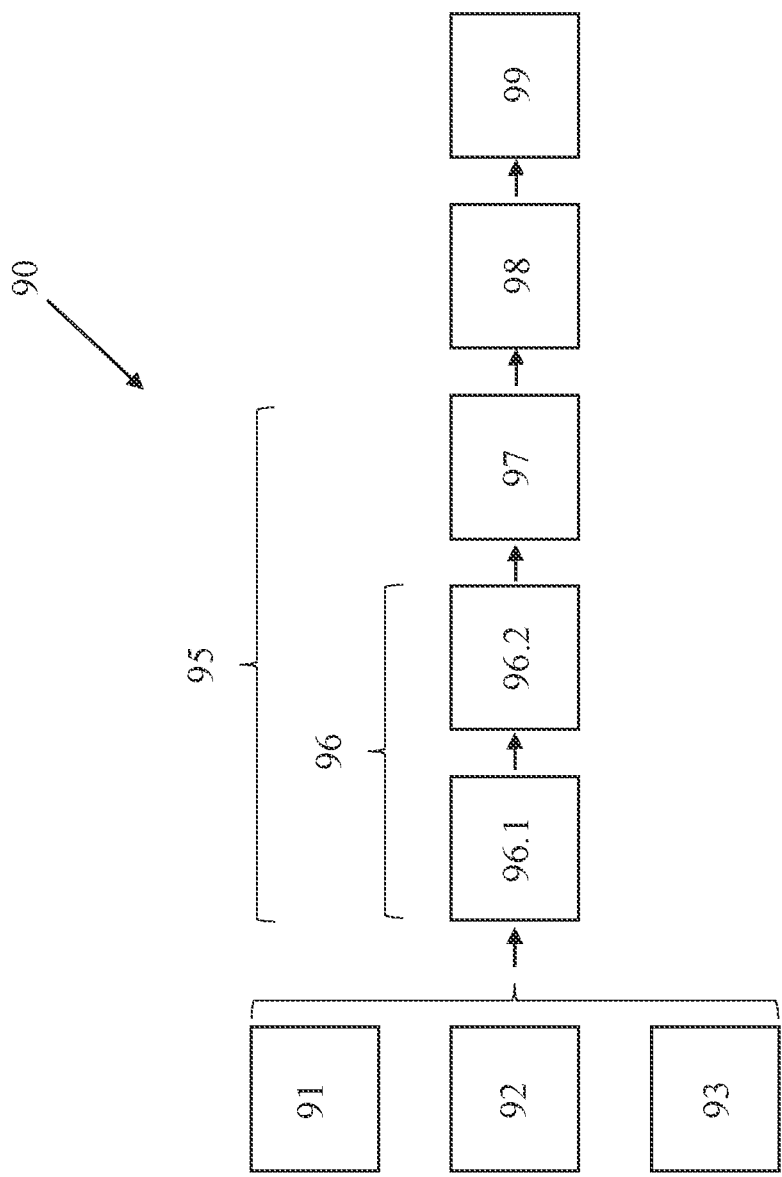

SEMICONDUCTOR TRANSISTOR DEVICE AND METHOD OF MANUFACTURING THE SAME

TECHNICAL FIELD

The present disclosure relates to a semiconductor transistor device with a vertical channel formed in a body region.

BACKGROUND

In a vertical field effect transistor, a vertical channel is formed in the body region. Laterally aside, the gate region is arranged, comprising a gate interlayer dielectric and a gate electrode. In the body region, a channel electrically connecting the source and the drain region is or can be formed, which can be controlled by applying a voltage to the gate electrode. To avoid a floating body region, it can be electrically contacted by a body contact region made of a conductive material. The body region can for instance be shorted to the source region to eliminate an intrinsic parasitic NPN transistor, in particular in a power device.

SUMMARY

It is an object of the present application to provide a vertical transistor device with improved characteristics, as well as a method of manufacturing such a device.

A body contact region of the device, which is made of an electrically conductive material, forms a body contact area in an electrical contact with the body region. Therein, this body contact area is tilted with respect to a vertical and a lateral direction. The tilted body contact area can allow for a device optimization, depending on the requirements for example in terms of a reduction of the $R_{On}$ or a reduction of drain-induced barrier lowering (DIBL) or QGD. Which parameter is optimized can for instance depend from the orientation of the tilted body contact area, see in detail below.

Further embodiments and features are provided in this description and the dependent claims. Therein, the individual features shall be disclosed independently of a specific claim category, the disclosure relates to apparatus and device aspects, but also to method and use aspects. If for instance a device manufactured in a specific way is described, this is also a disclosure of a respective manufacturing process, and vice versa. In general words, this application provides a semiconductor switch device, in particular a field effect transistor device, with a body or base region contacted via a tilted contact area of a contact region made of a conductive material.

The tilted contact area is neither perpendicular nor parallel to the vertical direction, and consequently it is neither perpendicular nor parallel to the lateral direction as well. Generally, the "vertical" direction lies for instance perpendicular to a surface of the device, for example a surface of a layer of the device, e.g. the surface of a (silicon) substrate and/or a surface of an epitaxial layer (deposited on the substrate). The vertical direction points from the source to the drain region. The "lateral" direction lies perpendicular to the vertical direction, the device or chip area is for instance taken laterally. In case of a device constructed of a plurality identical transistor cells, these cells can be arranged translationally symmetrical in the lateral direction. The tilt of the body contact area with respect to the vertical and the lateral direction can particularly be visible in a vertical cross-section. In general, where reference is made to a "vertical cross-section", the sectional plane lies parallel to the horizontal and the lateral direction.

The body contact region is made of an electrically conductive material, in particular of a metal material, like for instance tungsten. For manufacturing such a device and forming the tilted body contact area, for instance a body contact groove having a tilted sidewall can be etched into the semiconductor body, e.g. into an epitaxial layer in which the body region is formed. The orientation of the tilt can for instance be adjusted by the etch sequence applied, see in detail below. Subsequently, the conductive material can be deposited to form the body contact region. In general, the tilted contact area is not necessarily the only contact area between the body region and the body contact region, the latter can for instance form an additional contact area aligned parallel to the lateral direction or parallel to the vertical direction (see FIG. 3 for illustration). Alternatively, the tilted contact area can be the only contact area formed between the body and the body contact region (see FIG. 1 for illustration).

The source and the drain region of the device are of a first conductivity type, and the body region is of a second conductivity type opposite to the first conductivity type. As a power device, the transistor can comprise a drift region vertically between the body and the drain region, wherein the drift region is of the first conductivity type like the drain region but has a lower doping than the latter. In the illustrated embodiments, the first conductivity type is n-type and the second conductivity type is p-type. The source and the body region, and possibly the drift region, can be formed in an epitaxial layer on the substrate, e.g. silicon substrate (the epitaxial layer and the substrate form the semiconductor body).

The gate region can comprise a gate electrode and a gate dielectric, in particular gate oxide, for instance silicon oxide. The gate electrode is the electrical conductive part of the gate region, it is capacitively coupled to the channel region via the gate dielectric. The gate electrode may for instance be made of metal or polycrystalline silicon (polysilicon). The gate region can be arranged in a gate trench etched into the semiconductor body (the gate dielectric can be formed at the sidewall of the trench, the gate electrode can be deposited into the trench, filling it at least partly). Optionally, a field plate can be provided in the gate trench below the gate electrode (split gate), isolated therefrom by an interlayer dielectric.

In addition or in particular as an alternative to such a split gate, the device can comprise a field electrode region which extends vertically into the semiconductor body, in particular into the drift region. This field electrode region is formed in a field electrode trench separate from the gate trench or gate trenches. Seen in a vertical cross-section, field electrode trenches and gate trenches can alternate in the lateral direction. In a field electrode trench, a field electrode made of a conductive material can be arranged, e.g. polysilicon. In addition, an insulation material filler can be arranged in the trench, isolating the field electrode from the semiconductor body, e.g. from the drift region.

The gate trenches can be longitudinal trenches. In general, the field electrode trenches can be longitudinal trenches as well, extending parallelly to the gate trenches. In this case, the device can be constructed of longitudinal cells, the lateral direction (direction of translational symmetry) lying perpendicular to the longitudinal extension (and to the vertical direction). Alternatively, in particular, the field electrode trenches can be needle trenches, the field electrode regions having a spicular or columnar shape. In this case, seen in a top view, the gate trenches can for instance form a grid defining cells, for example rectangular or quadratic cells. The cells can be translationally symmetrical in the lateral direction and e.g. in a further lateral direction perpendicular thereto and to the vertical direction.

In an embodiment, the tilted body contact area extends from the sidewall of a field electrode trench. Seen in a vertical cross-section, it can extend from the sidewall of this trench in direction to the gate region (and additionally upwards or downwards). In the following description, that end of the body contact area, which is arranged at the field electrode trench, is referred to as "proximal end" whereas the other end of the tilted body contact area is referred to as "distal end". The distal end is spaced from the field electrode trench, it can for instance be arranged laterally between the field electrode trench and the gate region, in particular seen in a vertical cross-section.

In an embodiment, the proximal end lies deeper with respect to the vertical direction than the distal end. The proximal end is arranged on a lower vertical height, namely at a greater depth in the vertical direction pointing downwards from source to drain. Orienting the body contact area this way can for instance lower the electric field below such that the depletion does not extend so far into the semiconductor body below, in particular into the drift region. Seen in a vertical cross-section, this body contact area can extend from the sidewall of the field electrode trench simultaneously up- and sidewards, namely towards the source region and towards the gate region.

In another embodiment, the proximal end of the body contact area lies higher than the distal end. It is arranged on a larger vertical height, namely at a smaller depth in the vertical direction pointing downwards. Seen in a vertical cross-section, the contact area can extend from the sidewall of the field electrode trench simultaneously down- and sidewards, towards a lower end of the body region and towards the gate region. This orientation of the body contact area can for instance be advantageous in terms of a DIBL reduction or possibly QGD lowering.

Generally, a field electrode contact region can be formed of the electrically conductive material in addition to the body contact region. The field electrode region has a field electrode contact area in electrical contact with the field electrode. Consequently, the field electrode and the body region can be contacted both via the conductive material. The field electrode and the field electrode contact region can be formed of different materials, the former for instance of polysilicon and the latter of metal, e.g. tungsten.

An insulation material filler arranged in the field electrode trench in addition to the field electrode can separate the field electrode from the semiconductor body, e.g. from the drift region. Seen in a vertical cross-section, it can be arranged laterally between the field electrode and the drift region. In an embodiment, the field electrode projects vertically above the insulation material filler, an upper end of the insulation material filler lying deeper than an upper end of the field electrode. Referring for instance to a field electrode trench in which the electrode and insulation material filler have the same vertical height initially (in an intermediate step during manufacturing), an upper portion of the insulation material can for example be etched back when etching the body contact groove. In other words, in this example, the body contact groove can intersect the sidewall of the field electrode trench on a vertical height below the upper end of the field electrode.

In an embodiment, at least a portion of the field electrode contact area formed between the field electrode contact region and the field electrode is arranged at a sidewall of the field electrode. Seen in a vertical cross-section, the conductive material can cover an upper portion of the field electrode laterally towards the gate region. In particular, it can cover the upper end of the field electrode upwards and the upper portion laterally, which can for instance allow for a large contact area and reliable contact.

Generally, the electrically conductive material can cover the upper face of the insulation material filler and the proximal end of the body contact area can be arranged on the same vertical height. As an alternative or in combination with the coverage of the upper face, the electrically conductive material can also cover a sidewall of the insulation material filler, namely the outer sidewall which faces the gate region. Seen in a vertical cross-section, it can cover an upper portion of the sidewall of the insulation material filler.

In an embodiment, the electrically conductive material covers both, the upper face and the sidewall of the insulation material filler. Seen in a vertical cross-section, the electrically conductive material can form a step at this upper corner of the insulation material filler. A respective step design shall also be disclosed independently of the tilted body contact area, e.g. in combination with a flat body contact area. For instance, the electrically conductive material can extend from the upper corner vertically downwards along the sidewall of the insulation material filler, and it can form a body contact area at a distance above an upper end of the body. Therein, the lateral distance between the step and a sidewall of the field electrode can be as large as the lateral distance between the field electrode and the body region (taken at a lower end of the body region).

Independently of whether the body contact area is tilted or not, the electrically conductive material can in particular cover the upper face of the insulation material filler completely, e.g. extend without a further step laterally towards the field electrode (seen for instance in a vertical cross-section). In combination with the field electrode projecting vertically above the insulation material filler (see above), the conductive material can for instance form a first step at the upper corner of the insulation material filler and a second step at the upper corner of the field electrode, the second step lying vertically higher than the first step.

In an embodiment, the insulation material filler is recessed into the field electrode trench, wherein this recess is filled with the electrically conductive material. For manufacturing such a structure, after etching and filling the field electrode trench, the upper portion of the insulation material filler can be etched back with a selective etch chemistry to form the recess. Therein, an upper portion of the sidewall of the field electrode trench is uncovered (the sidewall faces the field electrode). Subsequently, the recess can be filled with the electrically conductive material. Consequently, in the ready-made device, the electrically conductive material covers the upper portion of the sidewall of the field electrode trench. In other words, an upper section of the field electrode trench as defined by the sidewall is filled with the conductive material. At the upper end of the sidewall, the electrically conductive material can form a step, the body contact area extending into the body region from this step, downwards or upwards.

In an embodiment, a vertical distance between the body contact region and a lower end of the body region is 450 nm at maximum, further upper limits being for instance 375 nm or 300 nm at maximum. Possible lower limits can for instance be 10 nm, 15 nm 20 nm. In this embodiment, the smallest vertical distance between the body contact area and the lower end of the body region is considered, e.g. the vertical distance between a lower end of the body contact area and the lower end of the body region.

The smallest vertical distance between the body contact region and the lower end of the body region can be larger or smaller than or equal to a smallest lateral distance between the body contact region and the gate region. The smallest lateral distance between the body contact region and the gate region can for instance be 350 nm, 275 nm or 200 nm, possible lower limits being for instance 20 nm, 25 nm or 30 nm at minimum (these values shall also be disclosed independently of a relationship between lateral and vertical distance).

In an embodiment, the tilted body contact area encloses an angle of at least 10° with the lateral direction, further lower limits being for instance at least 20° or 30°. Possible upper limits can for instance be 80°, 70° or 60° at maximum. The angle considered is a cutting angle, namely the smaller of two congruent angles (which is acute). The body contact area and the lateral direction can form a respective angle particularly in a vertical cross-section. In case of a body contact area having a non-linear curved shape, e.g. in the cross-sectional view, the angle enclosed with the lateral direction varies along the curve, and a mean value of these angles is taken for the considerations above.

In an embodiment, the body contact area has, seen in a vertical cross-section, a concave shape with respect to the body region. The latter means that the concavity is visible from the body region. In other words, the body contact area is inwardly bulged, into the body contact area. It is bulged or warped away from the body region and, vice versa, bulged e.g. in direction to an insulation layer and/or an frontside metallization. In general, however, the body contact area can also have a convex shape with respect to the body region (and seen in a cross-sectional view), namely can be outwardly bulged, out of the body contact area. A convex body contact area is bulged or warped into the body region and, vice versa, bulged away from e.g. an insulation layer and/or an frontside metallization. As a further alternative, the body contact area can have a linear shape, namely extend as a straight line in the cross-sectional view. The concave shape can for instance be generated with an anisotropic body contact groove etch, whereas the convex shape can for instance be formed with an isotropic groove etch, in particular a respective silicon etch.

The application also relates to a method for manufacturing a semiconductor transistor device, wherein the body contact region is formed with the tilted body contact area. The tilt can be formed during the deposition of the conductive material, e.g. during the metal deposition. In particular, a body contact groove can be etched prior to the deposition of the conductive material, wherein the body contact groove has a sidewall tilted with respect to the vertical and the lateral direction (in particular seen in a vertical cross-section). The body contact groove is a cavity for the subsequent deposition of the conductive material, wherein the tilted sidewall defines the tilted body contact area. In particular, the conductive material can be deposited to form a direct contact with the semiconductor substrate at the tilted sidewall. Depending on the processing in detail, for instance a (brief) oxide etch can be applied between the groove etch and the deposition of the conductive material, for example to remove any native oxide from the semiconductor body.

In an embodiment, which relates to the body contact area extending from the sidewall of the field electrode trench, the etching of the body contact groove comprises different etch steps. For instance, the insulation material filler arranged in the field electrode trench can be etched in a first etch step with a first selective etch chemistry, e.g. an oxide etch chemistry. After etching back a portion of the insulation material filler, a portion of the semiconductor body aside can be etched in a second etch step with a second etch chemistry. As mentioned above, the etch chemistry of the semiconductor body etch can also influence the shape of the resulting tilted sidewall and, thus, the shape of the body contact area (e.g. concave or convex). The second etch chemistry can be a selective etch chemistry for the semiconductor body, or it can also etch the insulation material filler. With this sequence, e.g. a body contact area rising from the sidewall of the field electrode trench towards the body and source region can be formed.

Alternatively, the sequence can be changed. For instance, the semiconductor body aside the field electrode trench can be etched in a first etch step, in particular with a selective etch chemistry (which etches the semiconductor body but not the insulation material filler). In a subsequent etch step, the insulation material filler can be etched back, for instance with a selective or a non-selective etch chemistry (the latter etching also the semiconductor body). With a respective sequence, in particular a body contact area descending from the sidewall of the trench towards the lower end of the body region can be formed.

BRIEF DESCRIPTION OF THE DRAWINGS

Below, the transistor device and the manufacturing of the same are explained in further detail by means of exemplary embodiments. Therein, the individual features can also be relevant for this application in a different combination.

FIG. 8b illustrates a second etch step subsequently to the etch step of FIG. 8a; and FIG. 9 shows a flow diagram summarizing process steps for the manufacturing of a transistor device.

DETAILED DESCRIPTION

Figure 1:
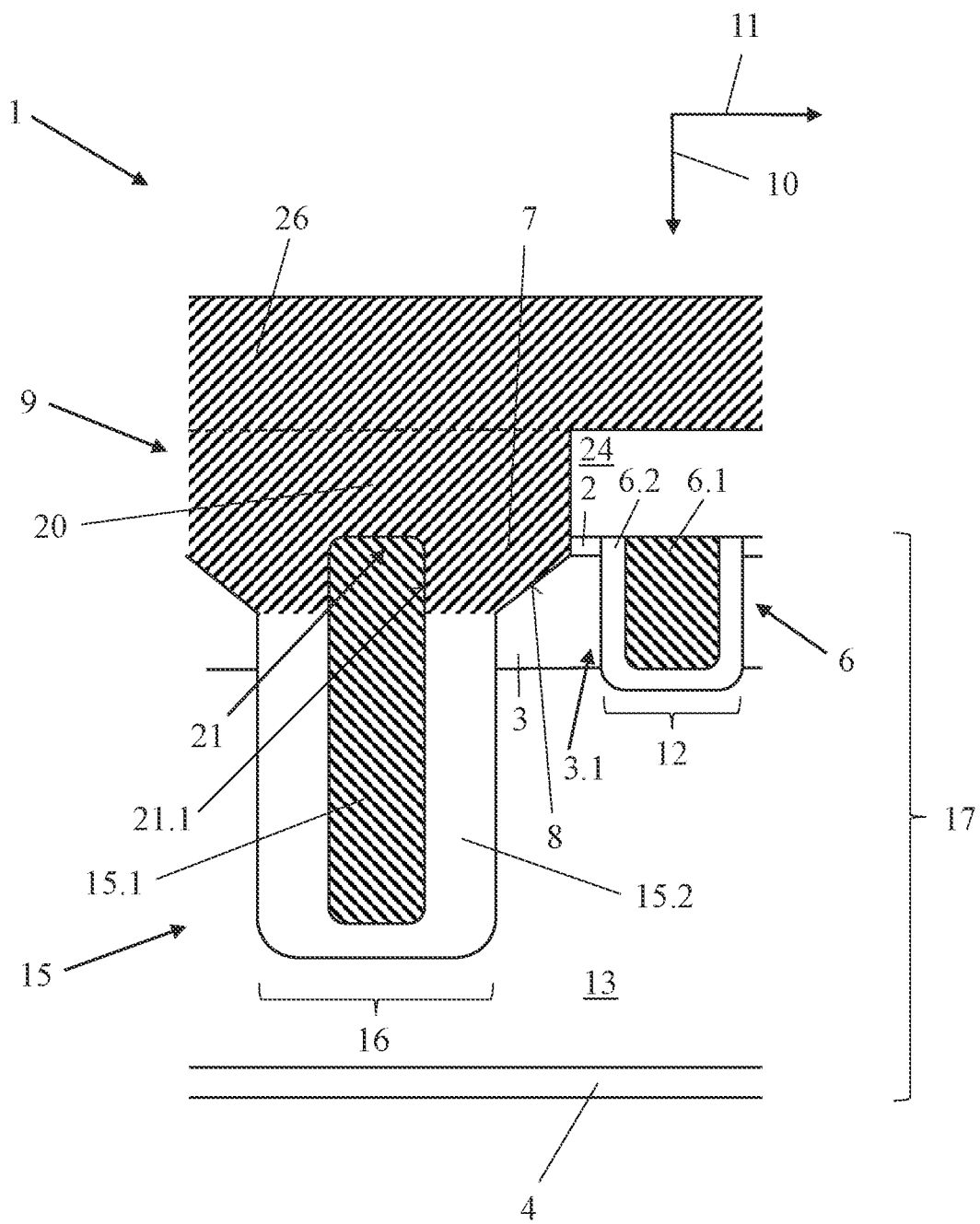
FIG. 1 shows a vertical cross-section of a transistor device having a body contact region with a tilted body contact area.

FIG. 1 shows a semiconductor transistor device 1 having a source region 2, a body region 3 and a drain region 4. In the body region 3, a channel region 3.1 is arranged, and aside a gate region 6 is formed. The gate region 6 comprises a gate electrode 6.1 and a gate dielectric 6.2. By applying a voltage to the gate electrode 6.1, a channel formation in the channel region 3.1 can be controlled. In the example shown here, the source region 2 and the drain region 4 are n-type regions, the body region 3 is a p-type region.

Vertically between the body region 3 and the drain region 4, a drift region 13 is arranged, namely in this case a n-type region with a lower doping concentration compared to the drain region 4. In addition to the gate region 6 formed in a gate trench 12, the device 1 comprises a field electrode region 15 formed in a field electrode trench 16. In the field electrode trench 16, a field electrode 15.1 and an insulation material filler 15.2 are arranged. The trenches 12, 16 extend into the semiconductor body 17 in the vertical direction 10, a lateral direction 11 is additionally shown for illustration.

The source region 2 and the body region 3 are connected via the same electrically conductive material 9, namely tungsten in this example. The electrically conductive material 9 forms a body contact region 7 with a body contact area 8. Via the latter, the electrical contact to the body region 3 is formed. Therein, the body contact area 8 is tilted with respect to the vertical direction 10 and the lateral direction 11, it is neither parallel nor perpendicular to these directions 10, 11.

Figure 2:
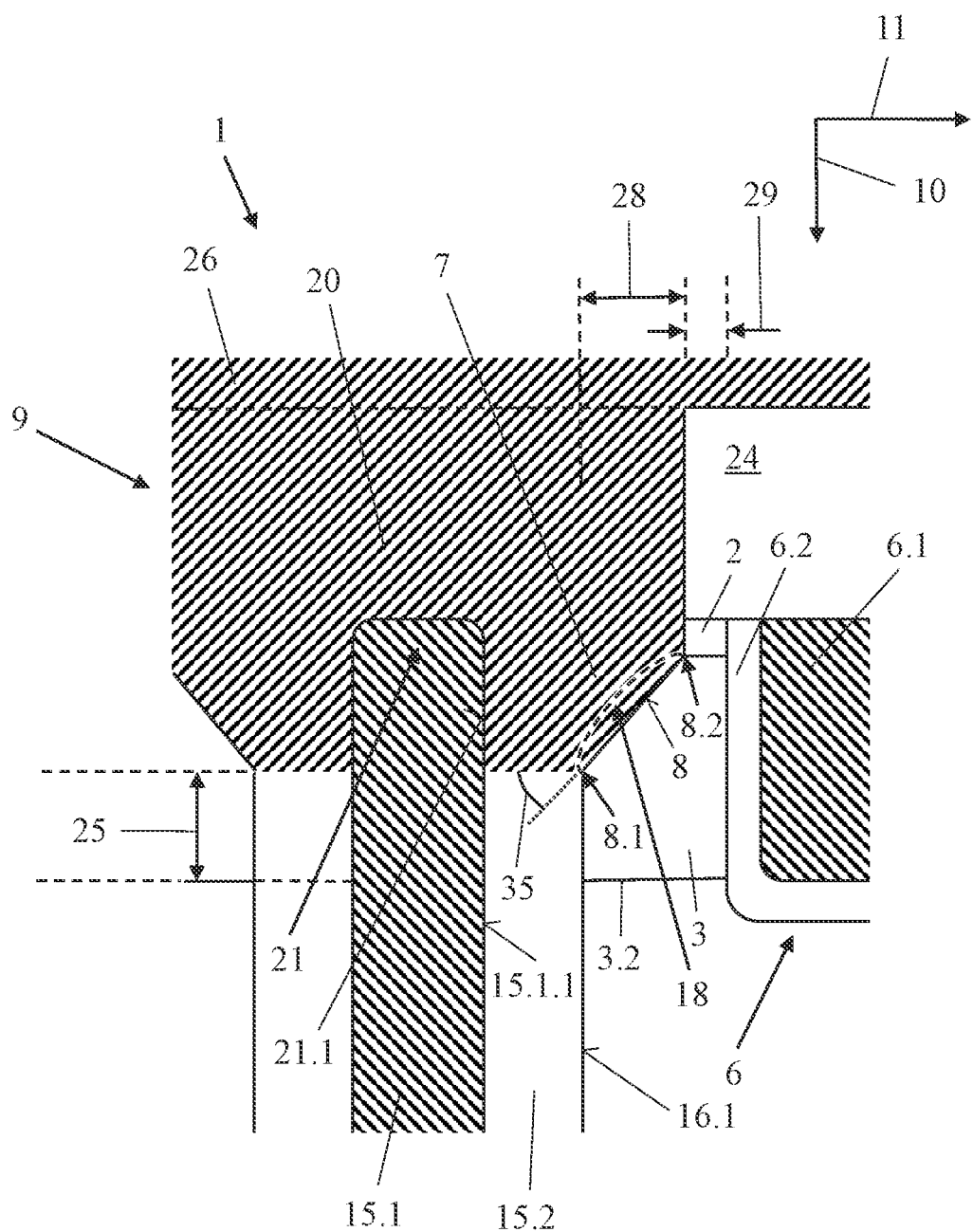
FIG. 2 shows a detailed view of the transistor device of FIG. 1.

FIG. 2 shows a detailed view of the body contact region 7. The tilted body contact area 8 and the lateral direction 11 enclose an angle 35 of around 30° to 60°. The tilted body contact area 8 extends from a sidewall 16.1 of the field electrode trench 16 into the body region 3. A proximal end 8.1 of the body contact area 8 is arranged at the sidewall 16.1, and a distal end 8.2 is arranged at a lateral distance 28 from the sidewall 16.1. In the embodiment of FIGS. 1 and 2, the proximal end 8.1 lies deeper than the distal end 8.2.

A smallest vertical distance 25 between the body contact area 8 and a lower end 3.2 of the body region 3 is around 50 nm in this example. A minimum lateral distance 29 between the body contact area 8 and the body region 6, which is taken from the upper end 8.2 here, is around 80 nm in this example. Independently of these details, the tilted body contact area 8 can for instance lower the electric field below and allow for an $R_{On}$ optimization. As an alternative to the linear shape as shown, the dashed line illustrates a concave shape 18 which the tilted body contact area 8 can have alternatively.

In addition to the body contact region 7, the electrically conductive material 9 forms a field electrode contact region 20. Via a field electrode contact area 21, the field electrode contact region 20 is in an electrical contact with the field electrode 15.1. Therein, a portion 21.1 of the field electrode contact area 21 is arranged at a sidewall 15.1.1 of the field electrode 15.1. The body contact region 7 and the field electrode contact region 20 are formed of the same conductive material 9, tungsten in the example here. On top, a frontside metallization 26 is arranged (only partly visible in FIG. 2, see FIG. 1), deposited onto an insulation layer 24. The frontside metallization 26 can for instance be made of copper or aluminum, e.g. AlCu.

Figure 3:
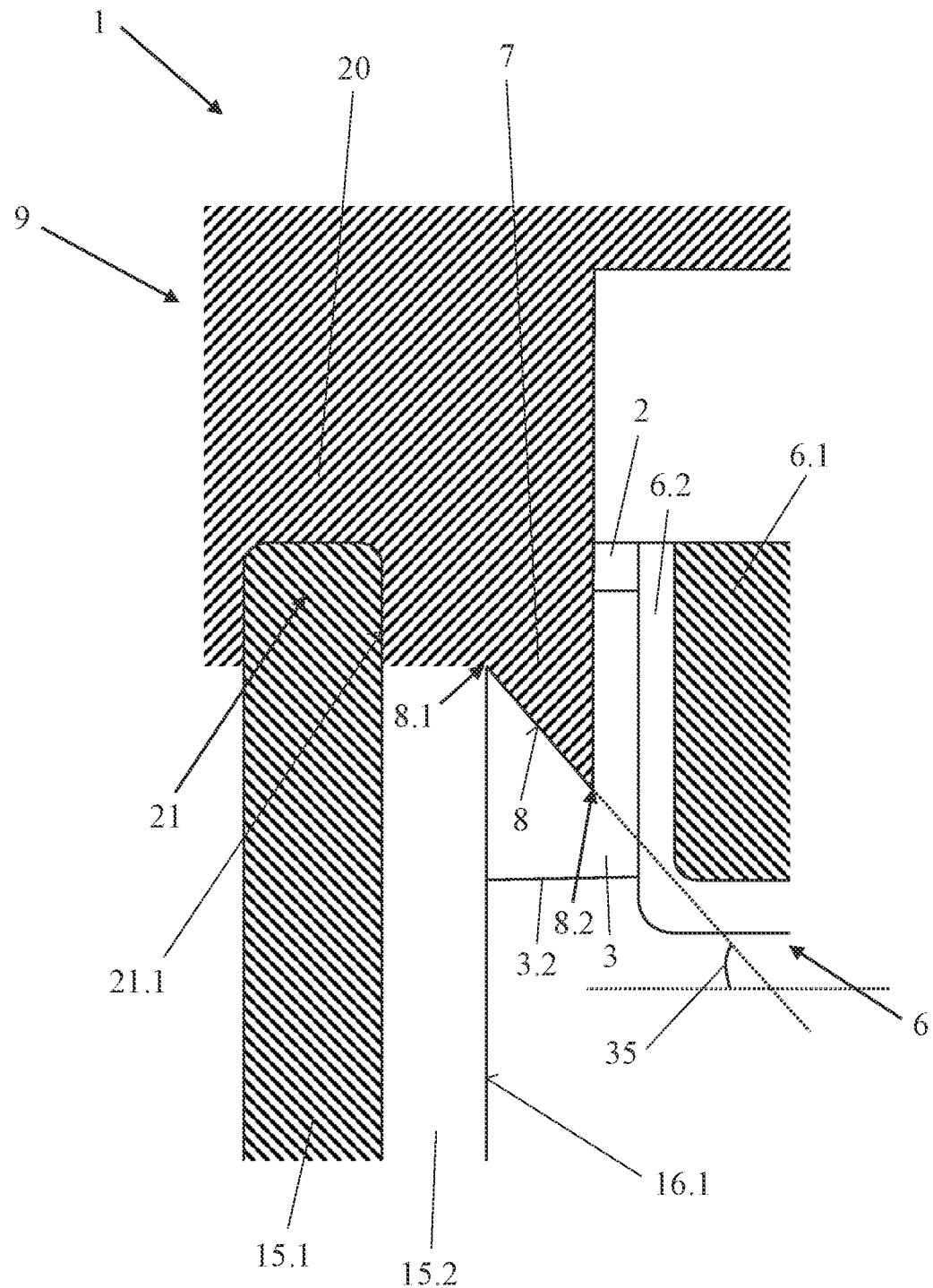
FIG. 3 shows a detailed view of an alternative transistor device with a tilted body contact area.

The transistor device 1 shown in FIG. 3 differs from the device 1 of FIGS. 1 and 2 in the orientation of the tilted body contact area 8. In this case, the tilted body contact area 8 descends from the sidewall 16.1 towards the lower end 3.2 of the body region 3. Consequently, the distal end 8.2 lies deeper with respect to the vertical direction 10 than the proximal end 8.1. Depending on the setup in detail, this design can for instance allow for a DIBL reduction. Apart from the different orientation of the body contact area 8, the setup is comparable to the device of FIGS. 1 and 2, the same reference numerals identifying parts with the same or a comparable function (which applies in general for this disclosure).

Figure 4:
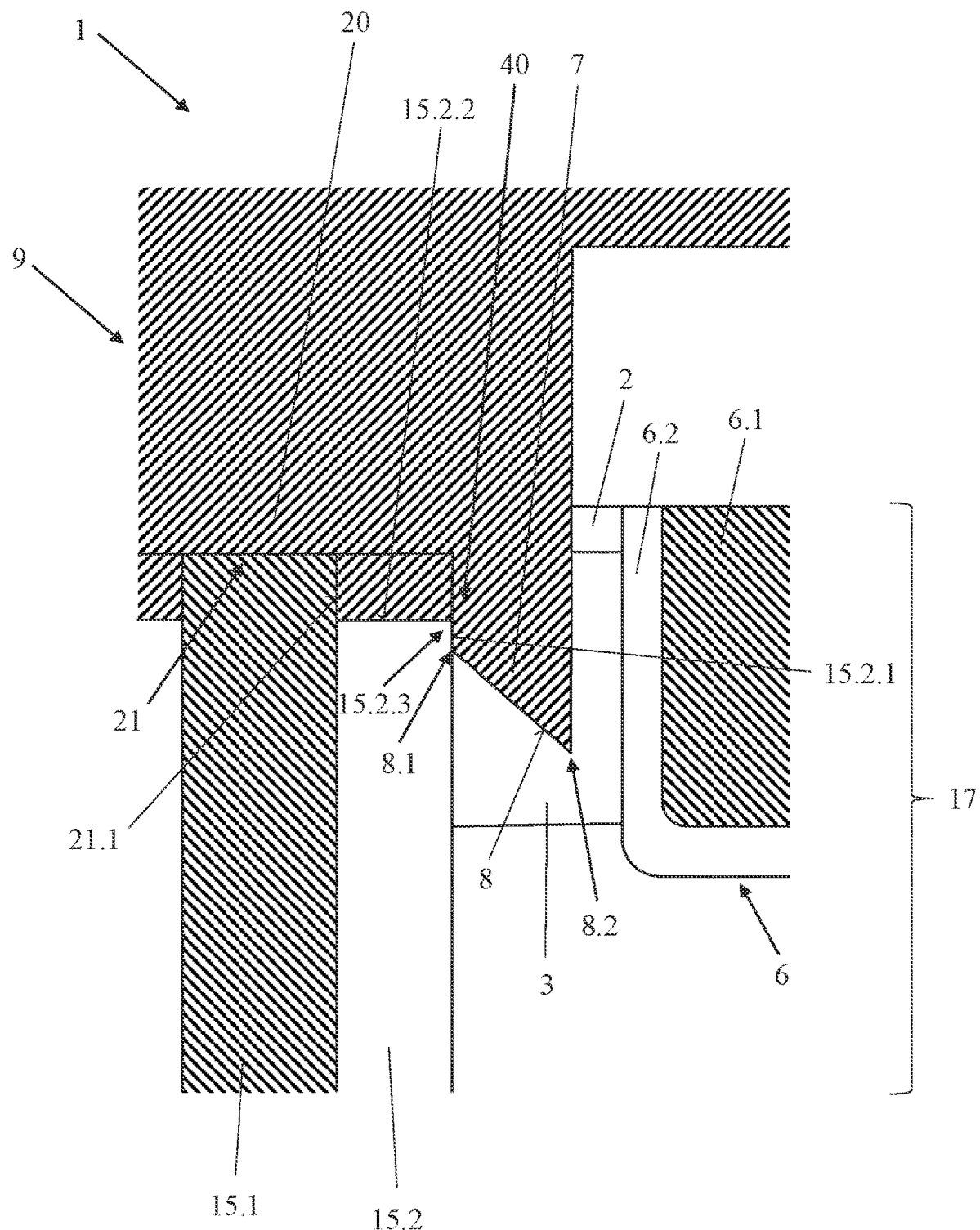
FIG. 4 shows a detailed view of a further alternative transistor device with a tilted body contact area.

FIG. 4 shows a further transistor device 1 with a tilted body contact area 8. It is oriented as in FIG. 3, the distal end 8.2 lies deeper than the proximal end 8.1. The embodiment of FIG. 4 differs from FIG. 3 in that the electrically conductive material 9 of the body contact region 7 encloses the insulation material filler 15.2 at an upper end. It contacts a sidewall 15.2.1 and an upper face 15.2.2 of the insulation material filler 15.2 at the upper corner 15.2.3. There, the electrically conductive material 9 forms a step 40. For forming such a device 1, a selective etch chemistry can be applied for etching deeper into the semiconductor body 17 without etching the insulation material filler 15.2 (e.g. after a selective insulation material filler etch).

Figure 5:
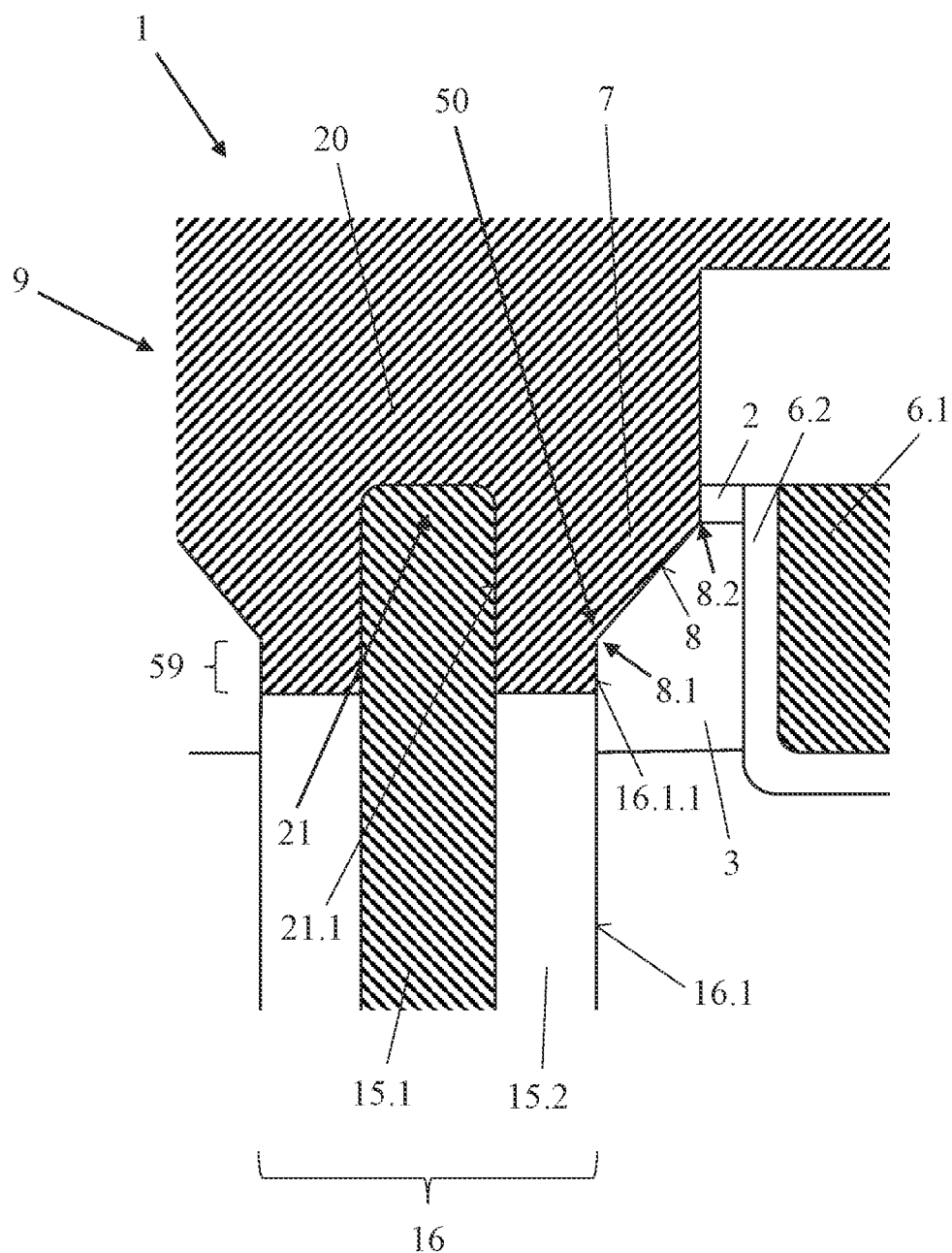
FIG. 5 shows a detailed view of a further alternative transistor device with a tilted body contact area.

FIG. 5 shows a further transistor device 1, wherein the tilted body contact area 8 is oriented as in the embodiment of FIGS. 1 and 2, the proximal end 8.1 lying deeper than the distal end 8.2. The design differs from FIGS. 1 and 2 in that the electrically conductive material 9 extends into a recess 59 formed in the field electrode trench 16 by etching back the insulation material filler 15.2. For forming the recess 59, the insulation material filler 15.2 can be etched back with a selective etch chemistry, wherein an upper end 16.1.1 of the sidewall 16.1 of the field electrode trench 16 is uncovered. When the electrically conductive material is deposited subsequently, it covers this upper end 16.1.1 and forms a step 50 there. From the step 50, the body contact area 8 extends into the body region 3.

Figure 6:
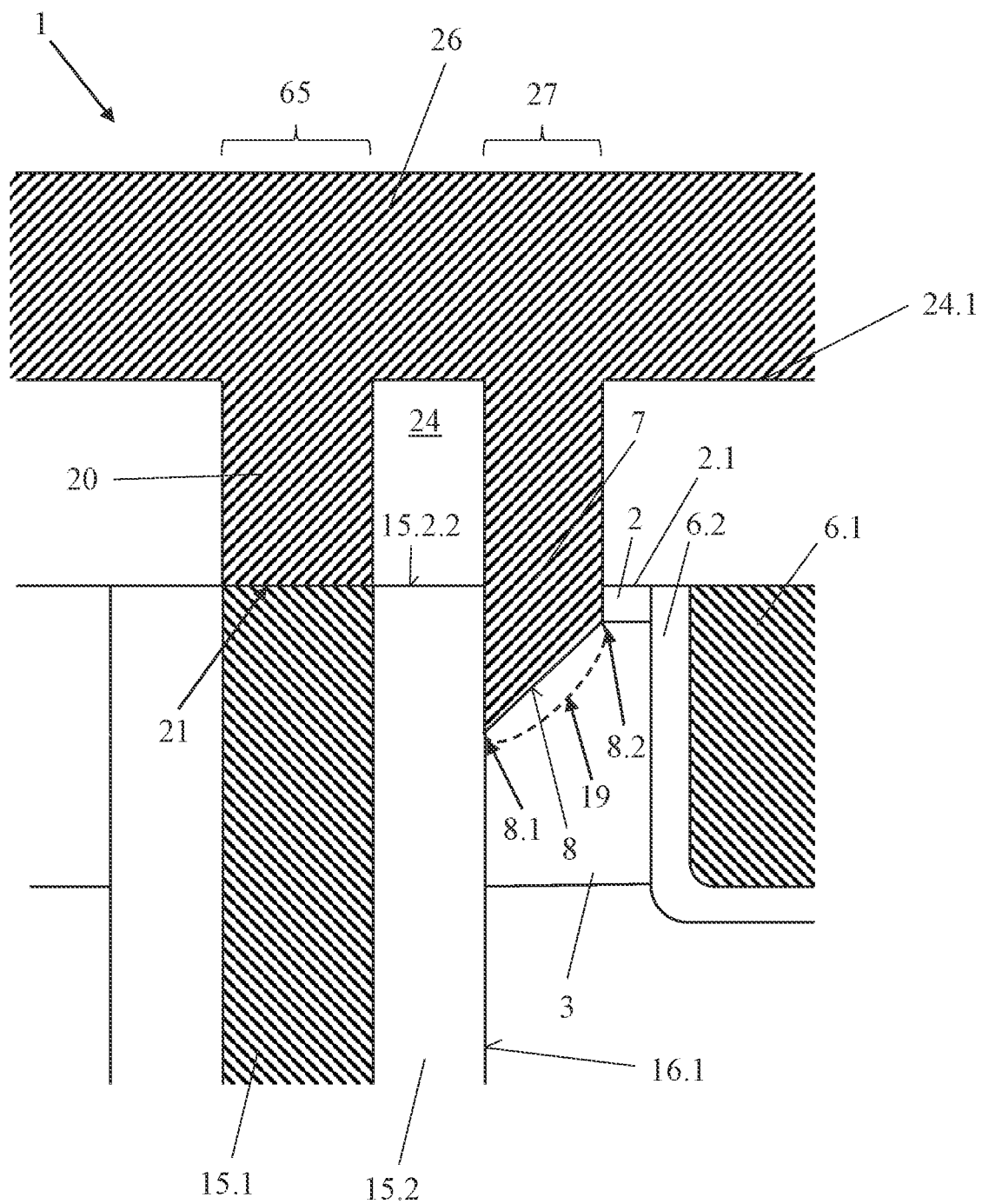
FIG. 6 shows a detailed view of a further alternative transistor device with a tilted body contact area.

FIG. 6 shows a further transistor device 1 with a tilted body contact area 8 which rises from the proximal end 8.1 to the distal end 8.2 (as in FIGS. 1, 2 and 5). It differs therefrom in that the field electrode contact region 20 and the body contact area region 7 are arranged in different grooves 27,65 intersecting the insulation layer 24 separately. The body contact region 7 is arranged in the body contact groove 27, and the field electrode contact region 20 is arranged in a separate field electrode contact groove 65. Vertically below an upper end 24.1 of the insulation layer 24, the body contact area 7 and the field electrode contact region 20 are not connected to each other. However, in this example, the frontside metallization 26 forms an electrical connection vertically above the upper end 24.1 of the insulation layer 24. Here, the insulation material filler 15.2 is not recessed into the field electrode trench 16, its upper face 15.2.2 lies in one plane with an upper end 2.1 of the source region 2. As an alternative to the linear shape as shown, the dashed line illustrates a convex shape 19 which the tilted body contact area 8 can have alternatively.

Figure 7:
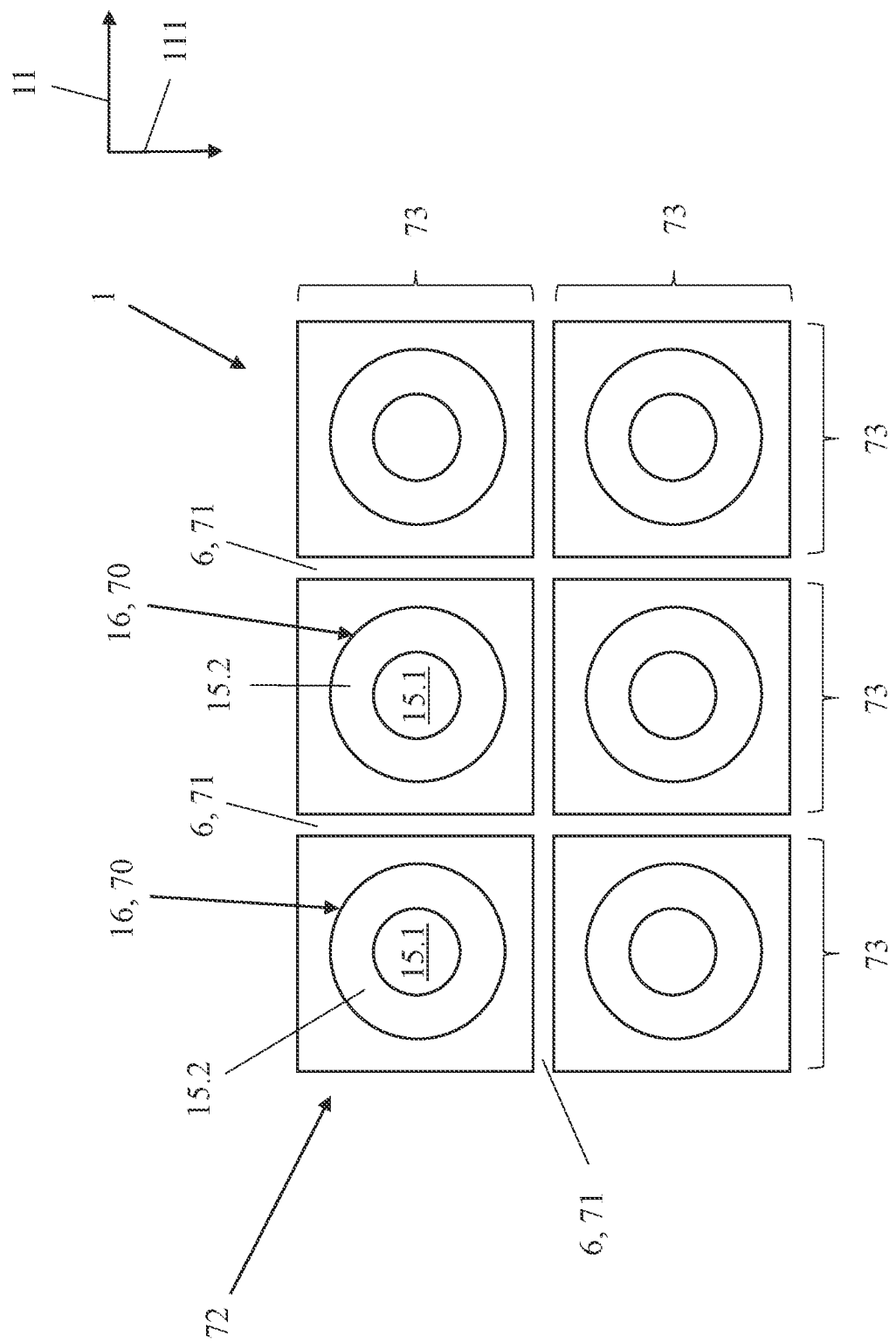
FIG. 7 shows a top view of a transistor device, illustrating a cell design.

FIG. 7 illustrates a transistor device 1 in a top view, namely in a vertical viewing direction. The field electrode trenches 16 are formed as needle trenches 70, the field electrode regions 15 having a spicular or columnar shape. The gate trenches 12 are longitudinal trenches 71 forming a grid 72 and defining cells 73. In this example, the cells 73 have a quadratic shape, a respective needle trench 70 being arranged in the center of each cell 73 respectively. Here, this cell-based design has a translational symmetry in the lateral direction 11 and in the further lateral direction 111.

Figure 8A:
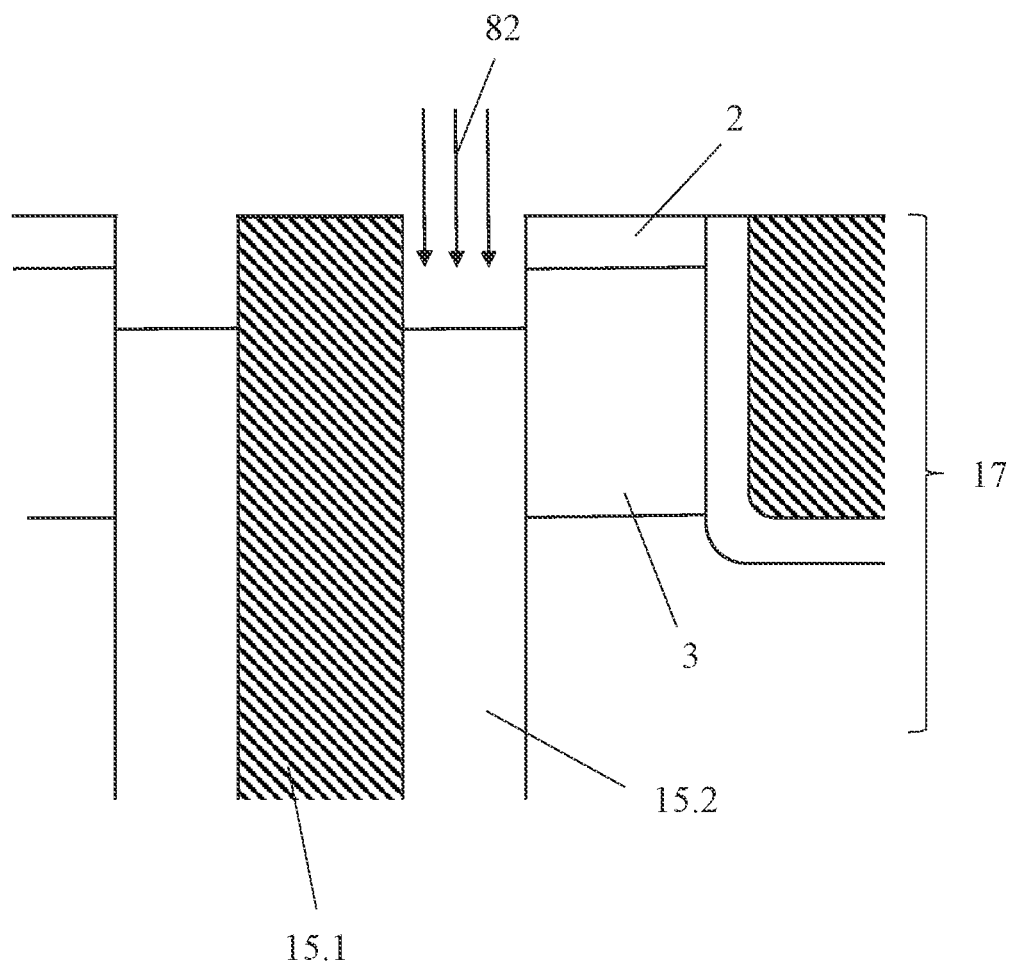
FIG. 8a illustrates a first etch step for manufacturing a transistor device as shown in FIGS. 1 and 2.
Figure 8B:
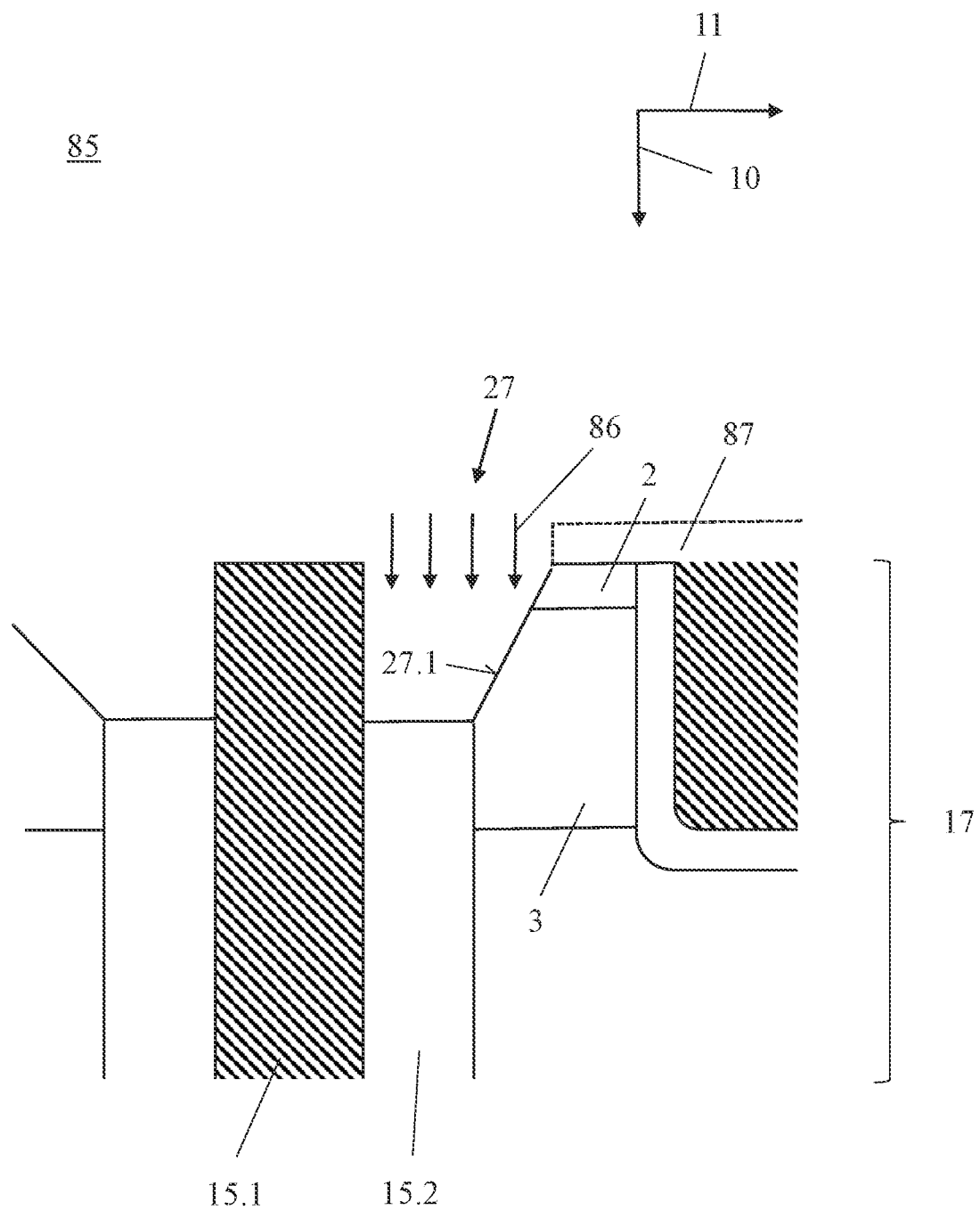

FIGS. 8a and 8b illustrate the etching of a body contact groove 27 for forming the device 1 of FIGS. 1 and 2. In the first etch step 81 shown in FIG. 8a, the insulation material filler 15.2 is etched with a first selective etch chemistry 82. The first selective etch chemistry 82 does not etch the semiconductor body 17, e.g. not the source region 2 and the body region 3. In a subsequent second etch step 85 shown in FIG. 8b, the body contact groove 27 is finally etched with a second etch chemistry 86. In the example shown here, the latter is non-selective, namely etches the insulation material filler 15.2 and the semiconductor body 17. Those regions of the semiconductor body 17, which shall not be etched, can for instance be protected by a mask 87. The resulting body contact groove 27 has a sidewall 27.1 tilted with respect to the vertical and lateral direction 10, 11. When the conductive material 9 is deposited thereafter (not shown in FIG. 8a,b), it contacts the tilted sidewall 27.1, resulting in a tilted body contact area 8.

The flow diagram of FIG. 9 illustrates some steps 90 for manufacturing a transistor device 1 disclosed here. After forming 91 the source region 2 and the body region 3, forming 92 the gate region 6, and forming 93 the field electrode region 15 (the order of the forming steps 91-93 can vary), the body contact region 7 can be formed 95. In particular, the body contact groove 27 can be etched 96 before depositing 97 the electrically conductive material. As described above, in an example, the etching 96 of the body contact groove 27 can comprise an etching 96.1 of the insulation material filler 15.2 and an etching 96.2 of the semiconductor body 17. After depositing 97 the electrically conductive material 9, and possibly after forming 98 the insulation layer 24, the frontside metallization 26 can be deposited 99.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor transistor device, comprising:
    a source region;
    a body region comprising a channel region extending in a vertical direction;
    a drain region;
    a gate region arranged aside the channel region in a lateral direction; and
    a body contact region made of an electrically conductive material,
    wherein the body contact region forms a body contact area,
    wherein the body contact region is in electrical contact with the body region via the body contact area,
    wherein the body contact area is tilted with respect to the vertical direction and the lateral direction,
    wherein the body contact area has a concave shape in a vertical cross-section of the semiconductor transistor device.

2. The semiconductor transistor device of claim 1, further comprising a field electrode arranged in a field electrode trench, wherein the tilted body contact area extends from a sidewall of the field electrode trench.

3. The semiconductor transistor device of claim 2, wherein the body contact area extends between a proximal end arranged at the sidewall of the field electrode trench and a distal end arranged in a lateral distance from sidewall of the field electrode trench, the proximal end lying deeper with respect to the vertical direction than the distal end.

4. The semiconductor transistor device of claim 2, wherein the body contact area extends between a proximal end arranged at the sidewall of the field electrode trench and a distal end arranged in a lateral distance from the sidewall of the field electrode trench, the proximal end lying higher with respect to the vertical direction than the distal end.

5. The semiconductor transistor device of claim 2, further comprising a field electrode contact region formed of the electrically conductive material, wherein the field electrode contact region comprises a field electrode contact area, and wherein the field electrode contact region is in electrical contact with the field electrode via the field electrode contact area.

6. The semiconductor transistor device of claim 5, wherein a portion of the field electrode contact area is arranged at a sidewall of the field electrode.

7. The semiconductor transistor device of claim 2, further comprising an insulation material filler arranged in the field electrode trench in addition to the field electrode, wherein an upper face of the insulation material filler is arranged on a lower vertical height than an upper end of the field electrode.

8. The semiconductor transistor device of claim 2, further comprising an insulation material filler arranged in the field electrode trench in addition to the field electrode, wherein the electrically conductive material forms a step at an upper corner of the insulation material filler, and wherein the electrically conductive material covers a sidewall and an upper face of the insulation material filler at the upper corner.

9. The semiconductor transistor device of claim 2, further comprising an insulation material filler arranged in the field electrode trench in addition to the field electrode, wherein the insulation material filler is recessed into the field electrode trench, and wherein the recess is filled with the electrically conductive material forming a step at a sidewall of the field electrode trench.

10. The semiconductor transistor device of claim 1, wherein a smallest vertical distance between the body contact region and a lower end of the body region is 450 nm at maximum.

11. The semiconductor transistor device of claim 1, wherein an angle formed between the tilted body contact area and the lateral direction is 10° at minimum and 80° at maximum.

12. A method for manufacturing a semiconductor transistor device, comprising:
    forming a source region;
    forming a body region comprising a channel region extending in a vertical direction;
    forming a drain region;
    forming a gate region arranged aside the channel region in a lateral direction; and
    forming a body contact region made of an electrically conductive material, wherein the body contact region forms a body contact area, wherein the body contact region is in electrical contact with the body region via the body contact area, wherein the body contact area is tilted with respect to the vertical direction and the lateral direction, wherein the body contact area has a concave shape in a vertical cross-section of the semiconductor transistor device.

13. The method of claim 12, wherein forming the body contact region comprises:
    etching a body contact groove having a sidewall tilted with respect to the vertical direction and the lateral direction; and
    depositing the electrically conductive material into the body contact groove to form the body contact region with the tilted body contact area at the tilted sidewall of the body contact groove.

14. The method of claim 13, further comprising:
    forming both a field electrode and an insulation material filler in a field electrode trench etched into a semiconductor substrate,
    wherein the body contact area extends from a sidewall of the field electrode trench, wherein etching the body contact groove comprises:

etching the insulation material filler arranged in the field electrode trench with a first selective etch chemistry in a first etch step; and etching a portion of the body region with a second etch chemistry in a subsequent second etch step.

15. A semiconductor transistor device, comprising:

a source region;

a body region comprising a channel region extending in a vertical direction;

a drain region;

a gate region arranged aside the channel region in a lateral direction; and a body contact region made of an electrically conductive material, wherein the body contact region forms a body contact area, wherein the body contact region is in electrical contact with the body region via the body contact area, wherein the body contact area is tilted with respect to the vertical direction and the lateral direction, wherein the tilted body contact area and the lateral direction enclose an angle in a range of 30° to 60°, wherein the body contact area has a concave shape in a vertical cross-section of the semiconductor transistor device.

16. The semiconductor transistor device of claim 15, wherein the tilted body contact area extends from a sidewall of a field electrode trench into the body region.

17. The semiconductor transistor device of claim 16, wherein a proximal end of the tilted body contact area is arranged at the sidewall of the field electrode trench and a distal end of the tilted body contact area is arranged at a lateral distance from the sidewall.

18. The semiconductor transistor device of claim 15, further comprising a field electrode arranged in a field electrode trench, wherein the tilted body contact area extends from a sidewall of the field electrode trench.

19. The semiconductor transistor device of claim 18, further comprising a field electrode contact region formed of the electrically conductive material, wherein the field electrode contact region comprises a field electrode contact area, and wherein the field electrode contact region is in electrical contact with the field electrode via the field electrode contact area.

* * * * *